United States Patent
Asano

(10) Patent No.: US 10,422,930 B2
(45) Date of Patent: Sep. 24, 2019

(54) OPTICAL ELEMENT AND PHOTO DETECTION DEVICE

(71) Applicant: Kabushiki Kaisha Toshiba, Minato-ku (JP)

(72) Inventor: Yusaku Asano, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 244 days.

(21) Appl. No.: 15/122,965

(22) PCT Filed: Sep. 1, 2014

(86) PCT No.: PCT/JP2014/072929
§ 371 (c)(1),
(2) Date: Sep. 1, 2016

(87) PCT Pub. No.: WO2015/141025
PCT Pub. Date: Sep. 24, 2015

(65) Prior Publication Data
US 2017/0075041 A1    Mar. 16, 2017

(30) Foreign Application Priority Data

Mar. 17, 2014 (JP) ................ 2014-053556

(51) Int. Cl.
*G02B 3/00* (2006.01)
*H01L 31/0232* (2014.01)

(52) U.S. Cl.
CPC ...... *G02B 3/0087* (2013.01); *H01L 31/02327* (2013.01)

(58) Field of Classification Search
CPC .......... G02B 3/0087; G02B 2003/0093; H01L 31/02327
(Continued)

(56) References Cited

U.S. PATENT DOCUMENTS 7,345,826 B2 * 3/2008 Suhara ............... B41J 2/471
359/652
2001/0003724 A1 6/2001 Yamaguchi et al.
(Continued)

FOREIGN PATENT DOCUMENTS

| CN | 1298842 A | 6/2001 |
|---|---|---|
| CN | 102901996 A | 1/2013 |

(Continued)

OTHER PUBLICATIONS

International Search Report and Written Opinion of the International Searching Authority dated Dec. 9, 2014 in PCT/JP2014/072929 filed Sep. 1, 2014 (with English translation).
Combined Taiwanese Office Action and Search Report dated Nov. 17, 2015 in Patent Application No. 103130641 (with English translation).

*Primary Examiner* — Dawayne Pinkney
(74) *Attorney, Agent, or Firm* — Oblon, McClelland, Maier & Neustadt, L.L.P.

(57) ABSTRACT

An optical element includes a first surface and a second surface opposite to the first surface, and includes a first region. A refractive index of the first region is asymmetric with respect to a first axis. The first axis passes through a first position and is parallel to a first thickness direction. The first refractive index is highest or lowest at the first position in the first region. The first thickness direction is from the first surface toward the second surface in the first region.

12 Claims, 9 Drawing Sheets

(58) Field of Classification Search
USPC .................................................. 359/652–655
See application file for complete search history.

(56) References Cited

U.S. PATENT DOCUMENTS

| | | |
|---|---|---|
| 2003/0063783 A1 | 4/2003 | Higuchi |
| 2004/0179255 A1 | 9/2004 | Suhara |
| 2006/0066775 A1 | 3/2006 | Toshikiyo |
| 2007/0035721 A1 | 2/2007 | Toshikiyo et al. |
| 2009/0020690 A1 | 1/2009 | Toda |
| 2011/0315290 A1 | 12/2011 | Nagayasu |
| 2013/0027779 A1 | 1/2013 | Okuno et al. |

FOREIGN PATENT DOCUMENTS

| | | |
|---|---|---|
| JP | 63-222047 A | 9/1988 |
| JP | 10-54945 | 2/1998 |
| JP | 2001-159702 A | 6/2001 |
| JP | 2004-198543 A | 7/2004 |
| JP | 2006-098790 A | 4/2006 |
| JP | 2006-352686 | 12/2006 |
| JP | 2009-015315 A | 1/2009 |
| JP | 2009-267000 A | 11/2009 |
| JP | 2012-25380 | 2/2012 |
| JP | 2013-243635 A | 12/2013 |
| TW | I256593 B | 6/2006 |
| TW | 200913238 A | 3/2009 |
| WO | WO 2013/080872 A1 | 6/2013 |

\* cited by examiner

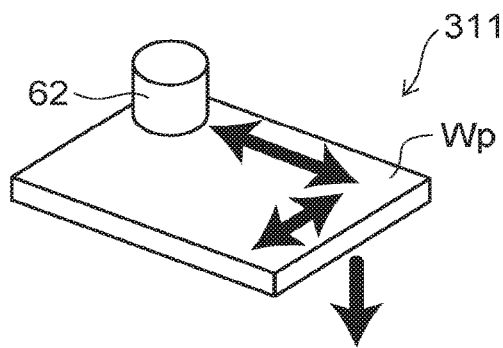
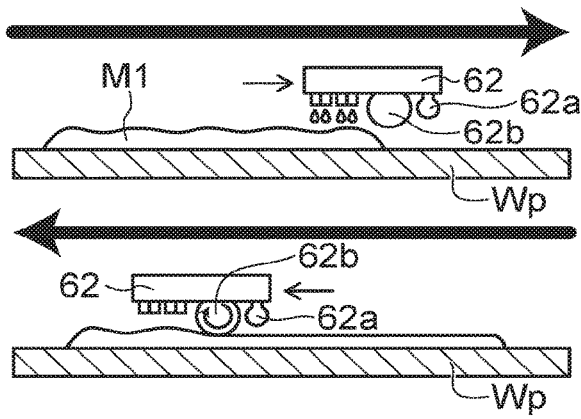
FIG. 15A          FIG. 15B
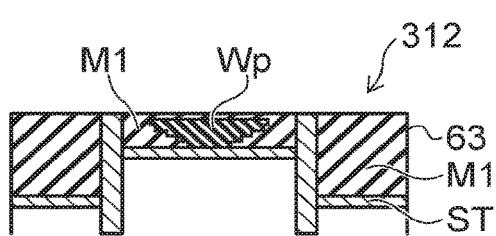
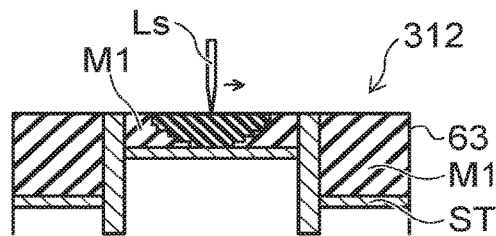
FIG. 16A          FIG. 16B

OPTICAL ELEMENT AND PHOTO DETECTION DEVICE

TECHNICAL FIELD

The embodiment of the invention relates to an optical element and a photo detection device.

BACKGROUND ART

A lens of a light transmissive material processed into a concave-convex shape with a lens configuration is used for a photo detection device. An optical element providing desired optical characteristics with high controllability is desired.

PRIOR ART DOCUMENT

Patent Document

[Patent Document 1] JP 2001-159702 A (Kokai)

SUMMARY OF INVENTION

Problem to be Solved by Invention

The embodiments of the invention provide an optical element providing desired optical characteristics with high controllability and a photo detection device.

Means for Solving Problem

According to one embodiment of the invention, an optical element has a first surface and a second surface opposite to the first surface, and includes a first region. A refractive index of the first region is asymmetric with respect to a first axis. The first axis passes through a first position and is parallel to a first thickness direction. The first refractive index is highest or lowest at the first position in the first region. The first thickness direction is from the first surface toward the second surface in the first region.

BRIEF DESCRIPTION OF DRAWINGS

FIG. 15A and FIG. 15B are schematic views illustrating another method for manufacturing the optical element according to the embodiment.
FIG. 16A and FIG. 16B are schematic views illustrating another method for manufacturing the optical element according to the embodiment.

EMBODIMENTS OF INVENTION

Figure 1A:
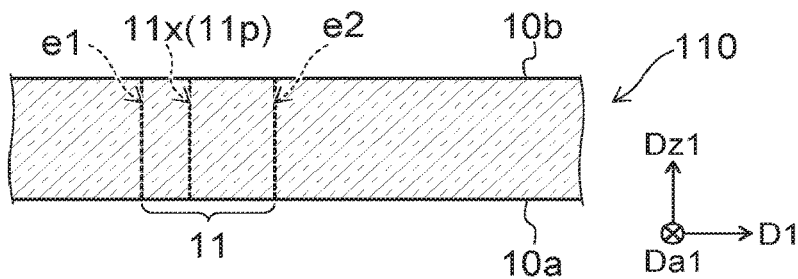
FIG. 1A to FIG. 1C are schematic views illustrating an optical element according to a first embodiment.

Embodiments of the invention will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the present specification and drawings, the same elements as those described previously with reference to earlier figures are labeled with like reference numerals, and the detailed description thereof is omitted as appropriate.

First Embodiment

Figure 1B:
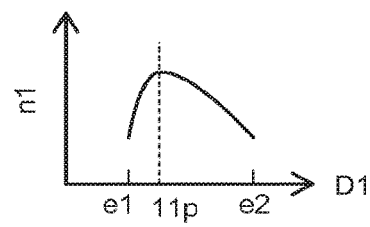
Figure 1C:
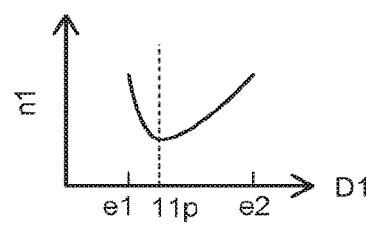

FIG. 1A to FIG. 1C are schematic views illustrating an optical element according to a first embodiment.

FIG. 1A is a cross-sectional view. FIG. 1B and FIG. 1B are graphs illustrating the characteristics.

As shown in FIG. 1A, an optical element 110 according to the embodiment has a first surface 10a and a second surface 10b. The second surface 10b is an opposite surface to the first surface 10a. The optical element 110 includes a first region 11.

The first region 11 has a first refractive index $n1$. The first refractive index $n1$ changes in the first region 11. For example, the first region 11 is, for example, a GRIN (gradient index) lens.

A thickness direction (a first thickness direction Dz1) of the optical element 110 is a direction from the first surface 10a toward the second surface 10b in the first region 11. One direction perpendicular to the first thickness direction Dz1 is taken as a first direction D1. A direction perpendicular to the first direction D1 and crossing the first thickness direction Dz1 is taken as a first cross direction Da1. In this example, the first cross direction Da1 is perpendicular to the first thickness direction Dz1.

In this example, the first refractive index $n1$ changes along the first direction D1.

FIG. 1B illustrates a change of the refractive index $n1$. In FIG. 1B, the horizontal axis represents a position on the first direction D1. The vertical axis represents the refractive index $n1$.

As shown in FIG. 1B, in this example, a rate of change of the first refractive index $n1$ along the first direction D1 is asymmetric.

For example, a position where the first refractive index $n1$ is highest or lowest in the first region 11 is taken as a first position $11p$. In the example of FIG. 1B, the first refractive index $n1$ is highest at the first position $11p$.

An axis passing through the first position 11p and parallel to the thickness direction Dz1 is taken as a first axis 11x. The first refractive index n1 is asymmetric with respect to the first axis 11x. The rate of change of the first refractive index n1 is asymmetric with respect to the first axis 11x.

One plane parallel to the first axis 11x is taken as a first plane (for example, Dz1-Da1 plane). The first plane is, for example, perpendicular to the first direction D1. The first refractive index n1 is, for example, asymmetric with respect to the first plane. The first refractive index n1 is asymmetric with respect to the first axis 11x. A state of being asymmetric with respect to the first axis 11x is a state of being not rotationally symmetric assuming the first axis 11x as an axis.

For example, a first end e1 and a second end e2 are included. The second end e2 is arranged with the first end e1 in the first direction D1. In this example, a distance between the first end e1 and the first position 11p (a distance along the first direction D1) is shorter than a distance between the second end e2 and the first position 11p (a distance along the first direction D1). That is, the first position 11p where the first refractive index n1 is the highest is near to the first end e1.

The absolute value of the change of the first refractive index n1 between the first end e1 and the first position 11p is greater than the absolute value of the change of the first refractive index n1 between the second end e2 and the first position 11p. In this example, the first end e1 and the second end e2 may be exchanged each other.

FIG. 1C shows another example. In this example, the first refractive index n1 is lowest at the first position 11p. Also in this case, an axis passing through the first position 11p and parallel to the thickness direction Dz1 is the first axis 11x. The first refractive index n1 is asymmetric with respect to the first axis 11x. Also in this case, the first refractive index n1 is asymmetric with respect to the first plane.

In this example, the first position 11p where the first refractive index n1 is the lowest is near to the first end e1. Also in this case, the absolute value of the change of the first refractive index n1 between the first end e1 and the first position 11p is greater than the absolute value of the change of the first refractive index n1 between the second end e2 and the first position 11p. In this example, the first end e1 and the second end e2 may be exchanged each other.

In the embodiment, a non-conventional anisotropic (non-isotropic) refractive index distribution can be obtained. Use of the anisotropic refractive index distribution increases an application range of the optical element. Thereby, a non-conventional optical device can be realized.

Figure 2A:
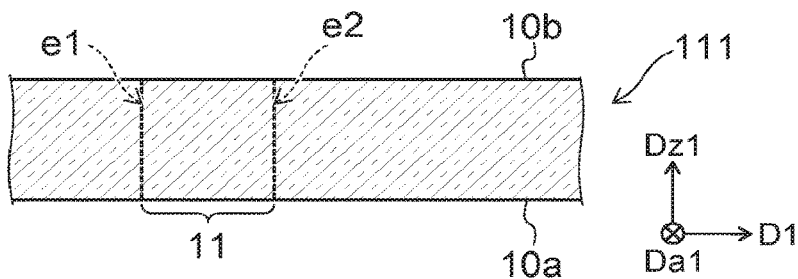
FIG. 2A to FIG. 2C are schematic views illustrating another optical element according to the first embodiment.

FIG. 2A to FIG. 2A are schematic views illustrating another optical element according to the first embodiment.

Figure 2B:
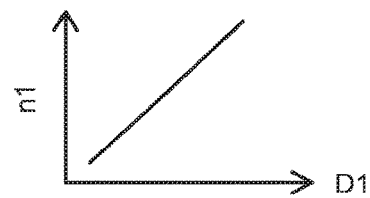
Figure 2C:
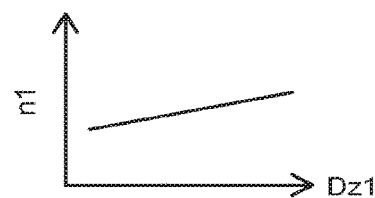

FIG. 2A is a cross-sectional view. FIG. 2B and FIG. 2C are graphs illustrating the characteristics.

As shown in FIG. 2A, the first region 11 is provided also in another optical element 111 according to the embodiment. In this example, the change of the first refractive index n1 along the first direction D1 is different from the change along the thickness direction Dz1.

The horizontal axis of FIG. 2B represents a position in the first direction D1. The horizontal axis of FIG. 2C represents a position in the first thickness direction Dz1. The vertical axes of these figures represent the first refractive index n1.

As shown in FIG. 2B, a rate of change of the refractive index n1 in the first direction D1 is high. As shown in FIG. 2C, a rate of change of the first refractive index n1 in the first thickness direction is low. The first refractive index n1 has the rate of change in the first direction D1 different from the rate of change in the first thickness direction Dz1. The rate of change of the first refractive index n1 in the first thickness direction Dz1 is different from the rate of change of the first refractive index n1 in the first direction D1 perpendicular to the first thickness direction Dz1.

In the embodiment, the optical element 110 may be combined with the optical element 111. That is, the first refractive index n1 has at least one of the rate of change in the first direction D1 different from the rate of change in the first thickness direction Dz1 or the rate of change in the first direction D1 asymmetric with respect to the first axis 11x.

According to the embodiment, an optical element providing desired optical characteristics with high controllability is obtained.

Figure 3A:
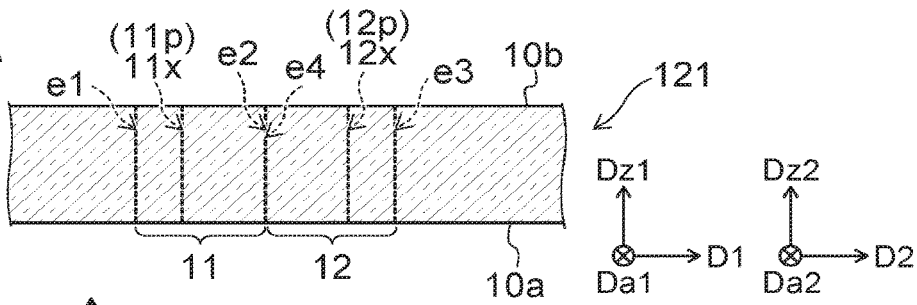
FIG. 3A to FIG. 3C are schematic views illustrating another optical element according to the first embodiment.
Figure 3B:
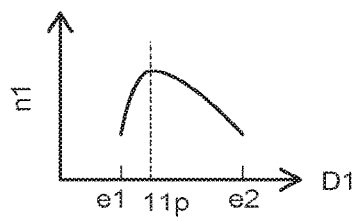
Figure 3C:
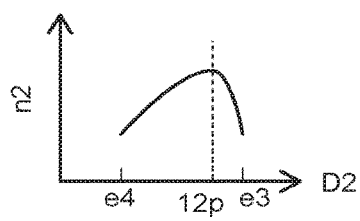

FIG. 3A to FIG. 3C are schematic views illustrating another optical element according to the first embodiment.

FIG. 3A is a cross-sectional view. FIG. 3B and FIG. 3C are graphs illustrating the characteristics.

As shown in FIG. 3A, another optical element 121 according to the embodiment further includes a second region 12. Other than the above is the same as the optical element 110. FIG. 3B illustrates a change of the first refractive index n1 in the first region 11. Also in this example, the first refractive index n1 is asymmetric.

The second region 12 is arranged with the first region 11 in the direction crossing the first thickness direction Dz1.

A direction from the first surface 10a toward the second surface 10b at a position of the second region 12 is taken as a second thickness direction Dz2. One direction perpendicular to the second thickness direction Dz2 is taken as a second direction D2. A direction perpendicular to the second direction D2 and crossing the second thickness direction Dz2 is taken as a second cross direction Da2. In this example, the second cross direction Da2 is perpendicular to the second thickness direction Dz2.

The second region 12 has a second refractive index n2. The second refractive index n2 changes along the second direction D2.

A position where the second refractive index n2 is the highest or the lowest in the second region 12 is taken as a second position 12p. In this example, the second refractive index n2 is upmost at the second position 12p. As with the description with respect to FIG. 1C, the second refractive index n2 may be the lowest. An axis passing through the second position 12p and parallel to the second thickness direction Dz2 is taken as a second axis 12x.

FIG. 3C illustrates a change of the second refractive index n2 of the second region 12. The horizontal axis of FIG. 3(c) represents a position in the second direction D2. The vertical axis represents the second refractive index n2.

As shown in FIG. 3C, the second refractive index n2 is asymmetric with respect to the second axis 12x. A rate of change of the second refractive index n2 is asymmetric with respect to the second axis 12x.

For example, one plane parallel to the second axis 12x is taken as a second plane (for example, Dz2-Da2 plane). The second plane is, for example, perpendicular to the second direction D2. The second refractive index n2 is, for example, asymmetric with respect to the second plane. A state of being asymmetric with respect to the second axis 12x is a state of being not rotationally symmetric assuming the second axis 12x as an axis.

In this way, multiple regions having asymmetric refractive index may be provided.

In this example, as with the optical element 111, a rate of change of the second refractive index n2 in the second direction D2 may be different from a rate of change in the second thickness direction Dz2.

That is, for example, the second refractive index n2 may have at least one of the rate of change in the second direction D2 different from the rate of change in the second thickness direction Dz2 or the rate of change in the second direction D2 asymmetric with respect to the second axis 12x.

In the example shown in FIG. 3C, the rate of change of the second refractive index n2 in the second direction D2 is asymmetric with respect to the second axis 12x. The second region 12 includes a third end 3e and a fourth end 4e. The third end e3 and the fourth end e4 are arranged along the second direction d2.

In this example, a distance between the third end e3 and the second position 12p is shorter than a distance between the fourth end e4 and the second position 12p. In this example, the second end e2 and the fourth end e4 are located between the first end e1 and the third end e3. The second end e2 and the fourth end e4 may contact each other and may be separated from each other.

Figure 4A:
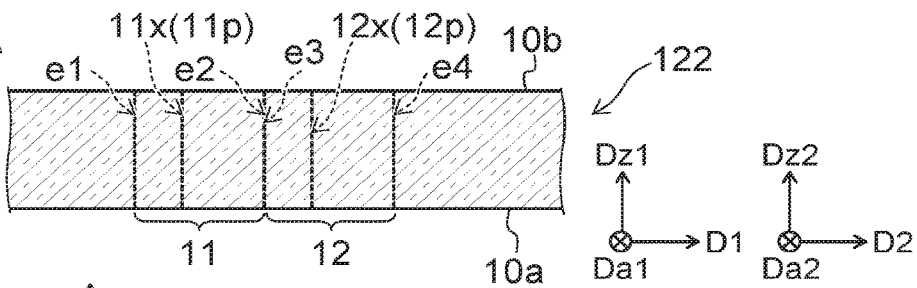
FIG. 4A to FIG. 4C are schematic views illustrating another optical element according to the first embodiment.
Figure 4B:
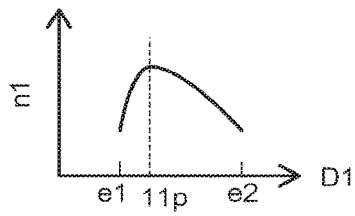
Figure 4C:
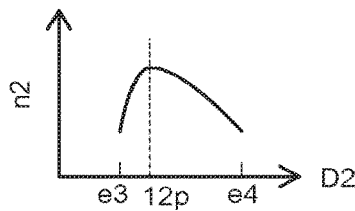

FIG. 4A to FIG. 4C are schematic views illustrating another optical element according to the first embodiment.

FIG. 4A is a cross-sectional view. FIG. 4B and FIG. 4C are graphs illustrating the characteristics.

As shown in FIG. 4A, another optical element 122 according to the embodiment also further includes the second region 12.

As shown in FIG. 4C, a rate of change of the second refractive index n2 in the second direction D2 is asymmetric with respect to the second axis 12x. In this example, the second end e2 and the third end e3 are located between the first end e1 and the fourth end e4. The second end e2 and the third end e3 may contact each other and may be separated from each other.

Figure 5A:
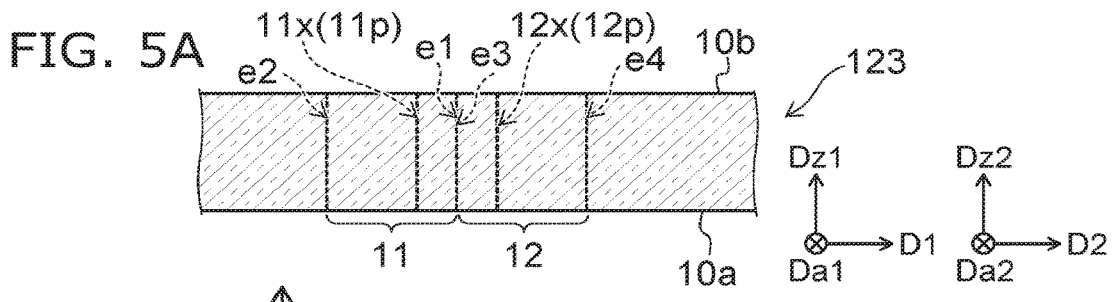
FIG. 5A to FIG. 5C are schematic views illustrating another optical element according to the first embodiment.
Figure 5B:
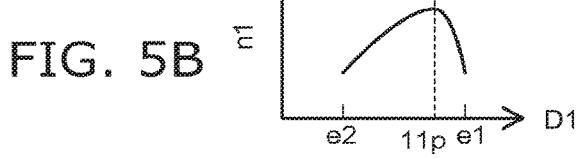
Figure 5C:
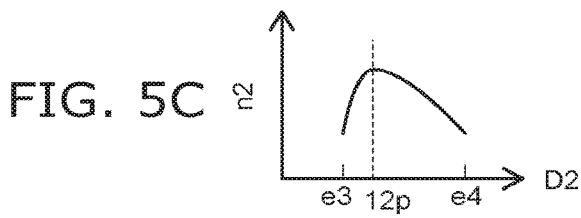

FIG. 5A to FIG. 5C are schematic views illustrating another optical element according to the first embodiment.

FIG. 5A is a sectional view. FIG. 5B and FIG. 5C are graphs illustrating the characteristics.

As shown in FIG. 5A, another optical element 123 according to the embodiment also further includes the second region 12.

As shown in FIG. 5C, a rate of change of the refractive index n2 in the second direction D2 is asymmetric with respect to the second axis 12x. In this example, the first end e1 and the third end e3 are located between the second end e2 and the fourth end e4. The first end e1 and the third end e3 may contact each other and may be separated from each other.

Figure 6A:
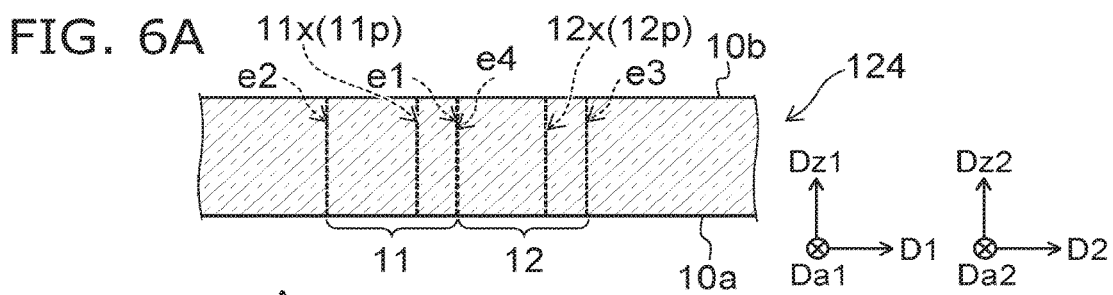
FIG. 6A to FIG. 6C are schematic views illustrating another optical element according to the first embodiment.
Figure 6B:
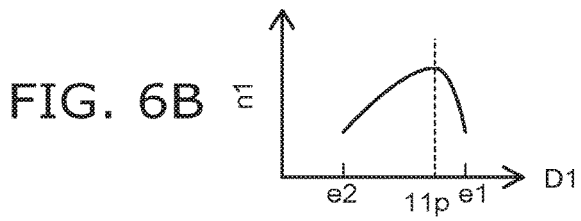
Figure 6C:
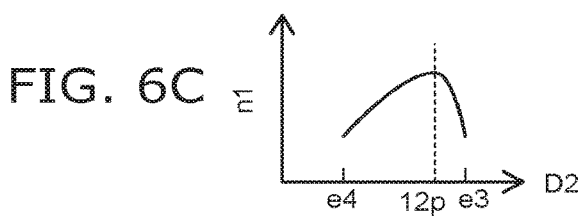

FIG. 6A to FIG. 6C are schematic views illustrating another optical element according to the first embodiment.

FIG. 6A is a cross-sectional view. FIG. 6B and FIG. 6C are graphs illustrating the characteristics.

As shown in FIG. 6A, another optical element 124 according to the embodiment also further includes the second region 12.

As shown in FIG. 6C, a rate of change of the second refractive index n2 in the second direct ion D2 is asymmetric with respect to the second axis 12x. In this example, the first end e1 and the fourth end e4 are located between the second end e2 and the third end e3. The first end e1 and the fourth end e4 may contact each other and may be separated from each other.

In this way, the embodiment can be modified in various variations.

In the optical elements 121 to 124, the relationship between the first direction D1 and the second direction D2 is arbitrary. For example, the second direction D2 may be parallel to the first direction D1 and may cross. For example, the second direction D2 may be perpendicular to the first direction D1. For example, the second direction D2 may be slanted to the first direction D1. For example, the second direction D2 may be either parallel or non-parallel to the first direction D1.

Figure 7:
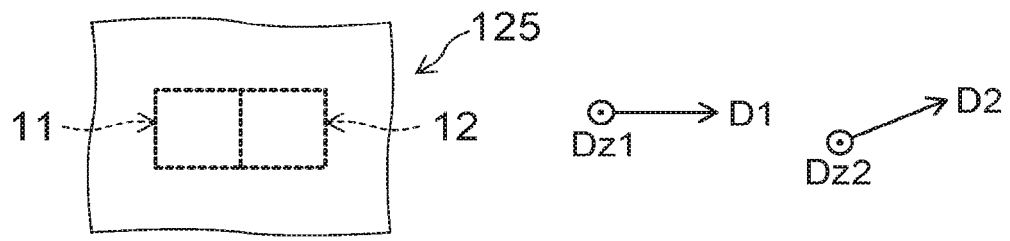
FIG. 7 is a schematic plan view illustrating another optical element according to the first embodiment.

FIG. 7 is a schematic plan view illustrating another optical element according to the first embodiment.

As shown in FIG. 7, the first region 11 and the second region 12 are provided also in another optical element 125 according to the embodiment. For example, the absolute value of an angle between the first direction D1 and the second direction D2 is less than 45 degrees.

Figure 8:
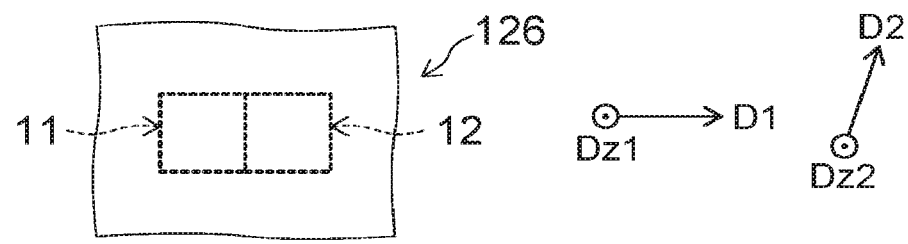
FIG. 8 is a schematic plan view illustrating another optical element according to the first embodiment.

FIG. 8 is a schematic plan view illustrating another optical element according to the first embodiment.

As shown in FIG. 8, the first region 11 and the second region 12 are provided also in another optical element 126 according to the embodiment. For example, the absolute value of an angle between the first direction D1 and the second direction D2 is not less than 45 degrees and not more than 90 degrees.

Figure 9:
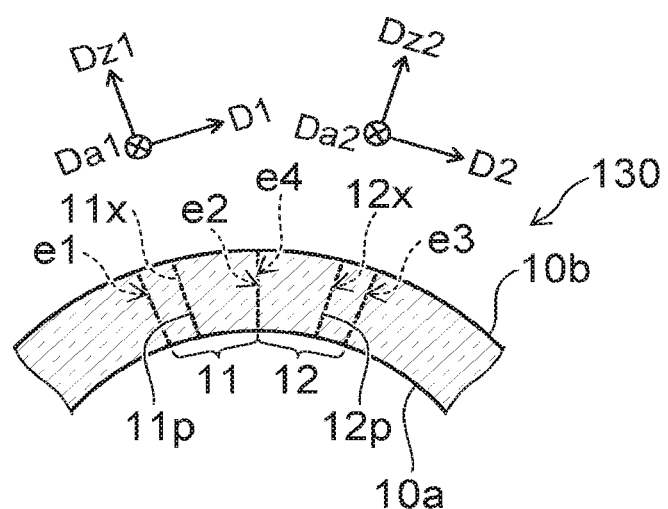
FIG. 9 is a schematic cross-sectional view illustrating another optical element according to the first embodiment.

FIG. 9 is a schematic cross-sectional view illustrating another optical element according to the first embodiment.

As shown in FIG. 9, in another optical element 130 according to the embodiment, the first surface 10a and the second surface 10b are curved surfaces.

In this example, the first thickness direction Dz1 is a direction from the first surface 10a toward the second surface 10b at a position of the first region 11. The first axis 11x passes through the first position 11p where the first refractive index n1 is the highest or the lowest in the first region 11, and is parallel to the first thickness direction Dz1.

Similarly, the second thickness direction Dz2 is a direction from the first surface 10a toward the second surface 10b at a position of the second region 12. The second axis 12x passes through the second position 12p where the second refractive index n2 is the highest or the lowest in the second region 12, and is parallel to the second thickness direction Dz2.

In this example, the first axis 11x is non-parallel to the second axis 12x. The first axis 11x is slanted to the second axis 12x. In this way, the first surface 10a and the second surface 10b may be curved surfaces.

In this example, the first surface 10a is curved to the second surface 10b to be substantially parallel. In the embodiment, the first surface 10a may be not along the second surface 10b. That is, at least one of the first surface 10a or the second surface 10b may be a plane. At least one of the first surface 10a or the second surface 10b may be a curved surface.

FIG. 10A to FIG. 10D are schematic views illustrating another optical element according to the first embodiment.

Figure 10A:
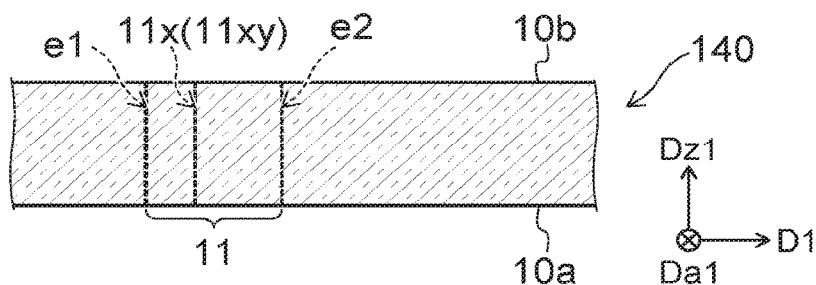
FIG. 10A to FIG. 10D are schematic views illustrating another optical element according to the first embodiment.
Figure 10B:
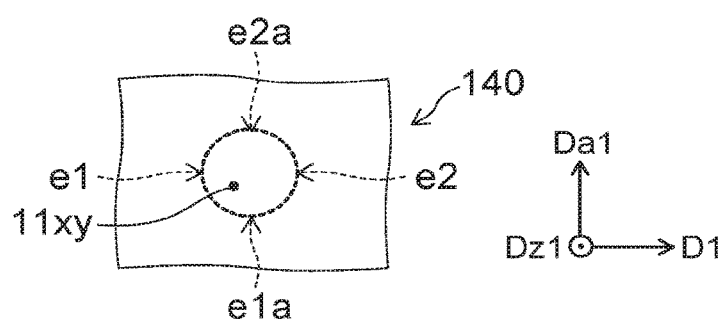
Figure 10C:
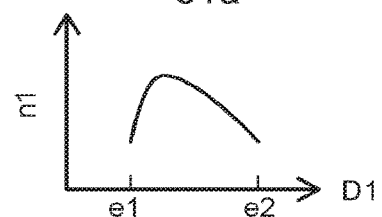
Figure 10D:
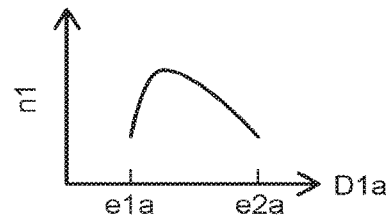

FIG. 10A is a cross-sectional view. FIG. 10B is a plan view. FIG. 10C and FIG. 10D are graphs illustrating the characteristics.

As shown in FIG. 10A, another optical element 140 according to the embodiment is provided with the first region 11.

As illustrated in FIG. 10B, the first refractive index n1 of the first region 11 is asymmetric in the first direction D1.

In this example, the first refractive index n1 of the first region 11 changes along the first direction D1, and additionally changes along the direction (first cross direction Da1) crossing the first direction D1 as well. In this example, the first cross direction Da1 is perpendicular to the first direction D1.

For simplifying the description, the first cross direction Da1 is assumed to be perpendicular to the first direction D1.

As shown in FIG. 10B, the first region 11 includes an end e1a and an end e2a. The end e1a and the end e2a are arranged in the first cross direction Da1.

As shown in FIG. 10D, the first refractive index n1 changes along the first cross direction Da1. The first refractive index n1 is asymmetric in the first cross direction Da1.

In this example, the first refractive index n1 is asymmetric with respect to the first plane (for example, Dz1-Da1 plane) parallel to the first axis 11x. For example, the first plane is perpendicular to the first direction D1. Furthermore, the first refractive index n1 is asymmetric with respect to the second plane (for example, Dz1-D1 plane) parallel to the first axis 11x. For example, the second plane is parallel to the first direction D1. That is, the second plane crosses the first plane.

In this way, the first refractive index n1 may be asymmetric in multiple planes (multiple directions).

FIG. 11A to FIG. 11D are schematic views illustrating another optical element according to the first embodiment.

Figure 11A:
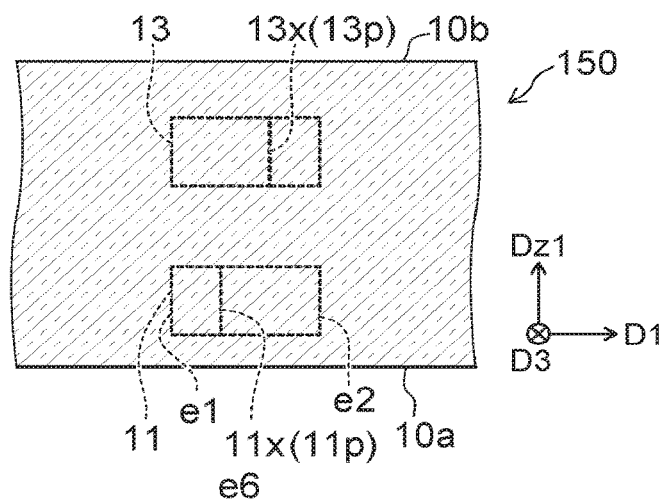
FIG. 11A to FIG. 11D are schematic views illustrating another optical element according to the first embodiment.
Figure 11B:
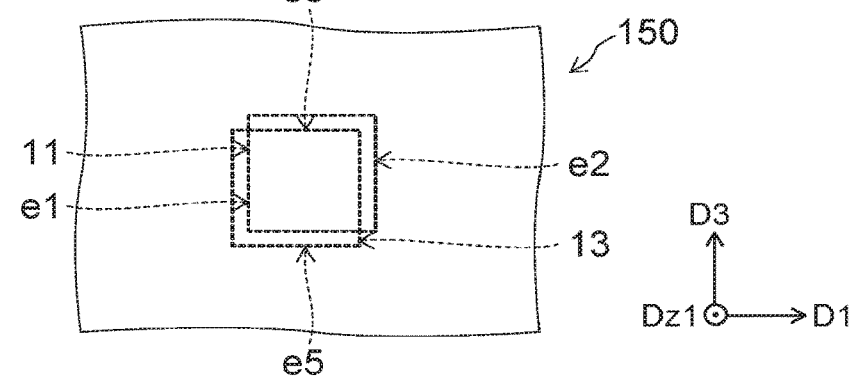
Figure 11C:
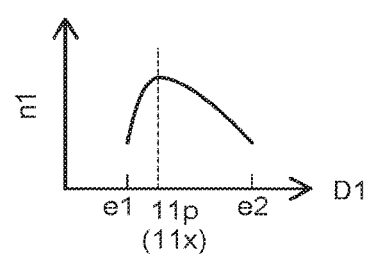
Figure 11D:
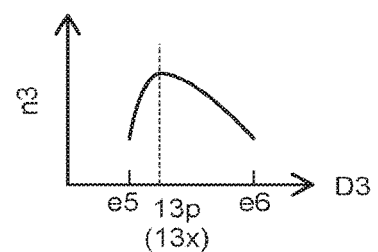

FIG. 11A is a cross-sectional view. FIG. 11B is a plan view. FIG. 11C and FIG. 11D are graphs illustrating the characteristics.

As shown in FIG. 11A, another optical element 150 according to the embodiment is provided with a third region 13 in addition to the first region 11.

As illustrated in FIG. 11C, the first refractive index n1 of the first region 11 is asymmetric in the first direction D1.

As shown in FIG. 11A, a position of the third region 13 along the first thickness direction Dz1 is different from the position of the first region 11 along the first thickness direction Dz1. For example, the third region 13 is stacked with the first region 11 along the first thickness direction Dz1.

The third region 13 has a third refractive index n3. The third refractive index n3 changes along a third direction D3 perpendicular to the first thickness direction Dz1.

For example, the third region 13 includes a fifth end e5 and a sixth end e6. The fifth end e5 and the sixth end e6 are arranged along the third direction D3.

A position where the third refractive index n3 is the highest or the lowest in the third region 13 is taken as a third position 13p. An axis passing through the third position 13p and parallel to the first thickness direction Dz1 is taken as a third axis 13x.

As shown in FIG. 11D, in this example, a rate of change of the third refractive index n3 in the third direction D3 is asymmetric with respect to the third axis 13x.

As with the optical element 111, the rate of change of the third refractive index n3 in the third direction D3 may be different from a rate of change in the first thickness direction Dz1.

That is, the third refractive index n3 may have at least one of the rate of change in the third direction D3 different from the rate of change in the first thickness direction Dz1 or the rate of change in the third direction D3 asymmetric with respect to the third axis 13x.

Second Embodiment

Figure 12A:
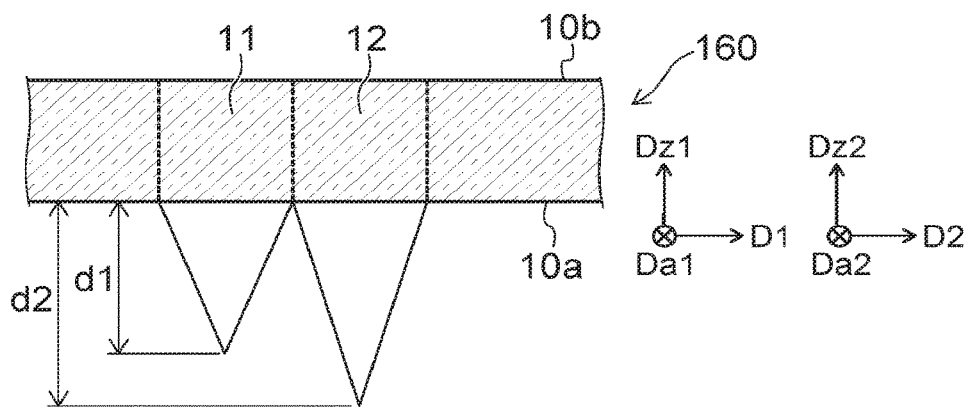
FIG. 12A to FIG. 12C are schematic cross-sectional views illustrating an optical element according to a second embodiment.
Figure 12B:
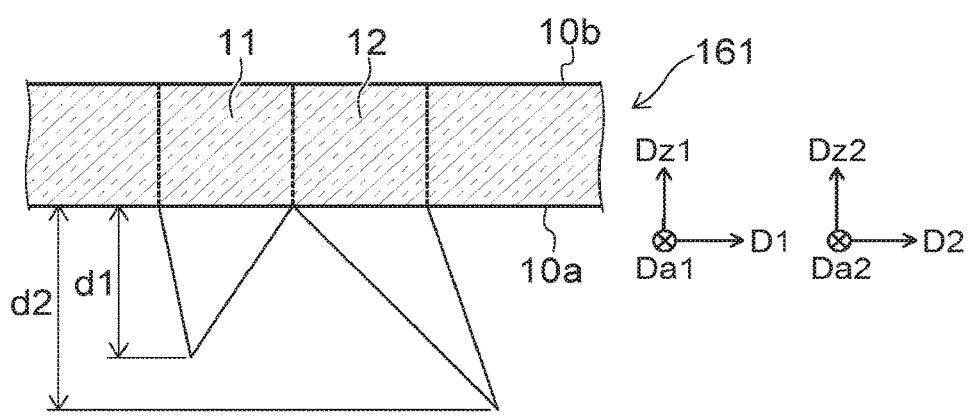
Figure 12C:
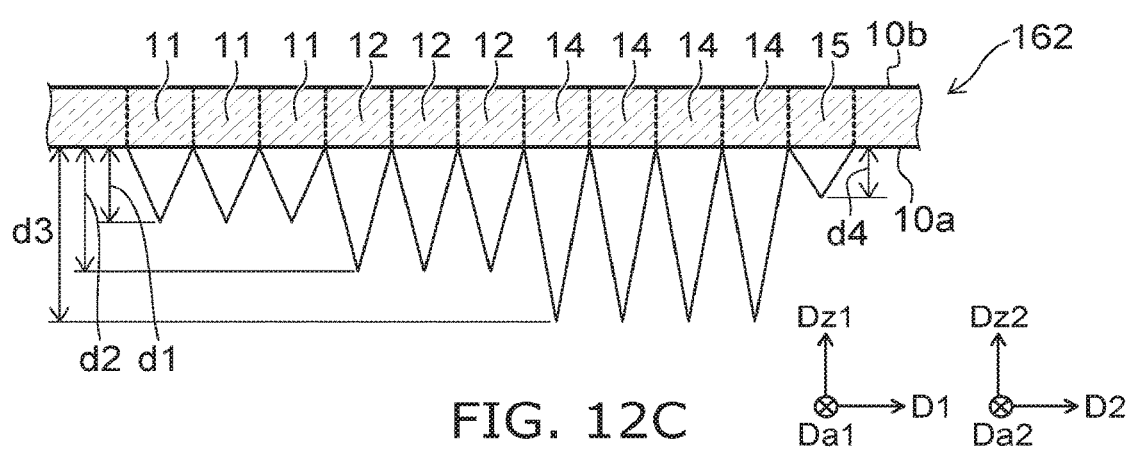

FIG. 12A to FIG. 12C are schematic cross-sectional views illustrating an optical element according to a second embodiment.

As shown in FIG. 12A, the first region 11 and the second region 12 are provided in an optical element 160 according to the embodiment.

The first region 11 has a first focal distance d1. The second region 12 has a second focal distance d2. The second focal distance d2 is different from the first focal distance d1.

Mutually different focal distances like this are obtained, for example, by letting a distribution of the first refractive index n1 in the first region 11 from a distribution of the second refractive index n2 in the second region 12 each other.

For example, when an object is irradiated with a light, there may be concavity and convexity on a surface of the object. In such a case, the light is applied using an optical element with a focal distance changed in accordance with the concavity and convexity. Thereby, both of the convexity part and concavity part of the concavity and convexity can be irradiated with the desired light.

In the optical element 160, the first refractive index n1 in the first region 11 is, for example, symmetric with respect to the Dz1-Da1 plane. The second refractive index n2 in the second region 12 is, for example, symmetric with respect to the Dz2-Da2 plane.

As shown in FIG. 12B, also in another optical element 161 according to the embodiment, the second focal distance d2 is different from the first focal distance d1. In the optical element 161, the first refractive index n1 in the first region 11 is, for example, asymmetric with respect to the Dz1-Da1 plane. The second refractive index n2 in the second region 12 is, for example, asymmetric with respect to the Dz2-Da2 plane.

In this way, in the embodiment, the focal distances are different each other in the multiple regions. The refractive index distribution in each region may be either symmetric or asymmetric.

As shown in FIG. 12C, in another optical element 162 according to the embodiment, regions with different focal distances are provided, and the number of at least some of the regions is multiple.

In this example, the number of the first regions 11 with the first focal distance d1 is 3. The number of the second regions 12 with the second focal distance d2 is 3. The number of the regions 14 with the third focal distance d3 is 4. The number of the regions 15 with the fourth focal distance d4 is 1. Also in this case, the refractive index in each region may be either symmetric or asymmetric.

Third Embodiment

The embodiment relates to a photo detection device.

Figure 13:
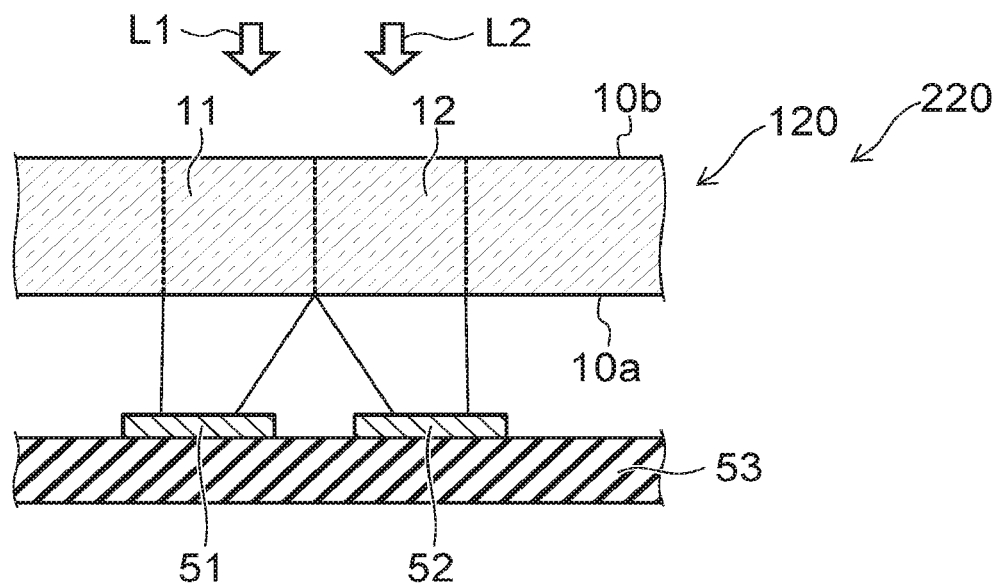
FIG. 13 is a schematic cross-sectional view illustrating a photo detection device according to a third embodiment.

FIG. 13 is a schematic cross-sectional view illustrating a photo detection device according to a third embodiment.

As shown in FIG. 13, a photo detection device 220 according to the embodiment includes an optical element 120, a first detection unit 51, and a second detection unit 52.

The optical element 120 can be based on, for example, one of the optical elements 121 to 126, 130, 140, 150, and 160, or a variation of them.

In this example, the first detection unit 51 and the detection unit 52 are provided on a substrate 53. These detection units include, for example, a photoelectric conversion film (semiconductor film or the like).

A light (first light L1) passing through the first region 11 is incident to the first detection unit 51. A light (first light L2) passing through the second region 12 is incident to the second detection unit 52.

For example, the refractive index distribution in the first region 11 is different from the refractive index distribution in the second region 12. The refractive index distribution is asymmetric. A traveling direction of the light incident to the optical element 120 changes in accordance with the refractive index distribution in these regions. For example, at a position where the detection unit is provided, a resolution different from a resolution of the light (first light L1, second light L2) before incidence to the optical element 120 can be obtained.

For example, the light can be detected with a resolution higher than a resolution corresponding to a pitch of the detection unit. In addition, desired characteristics can be obtained by combining the multiple detection units with the multiple regions of the optical element in accordance with the desired characteristics.

Hereinafter, examples of methods for manufacturing optical elements of the above first to third embodiments and the variations will be described. In the manufacturing method, for example, "3-dimensional print method" is used.

Figure 14:
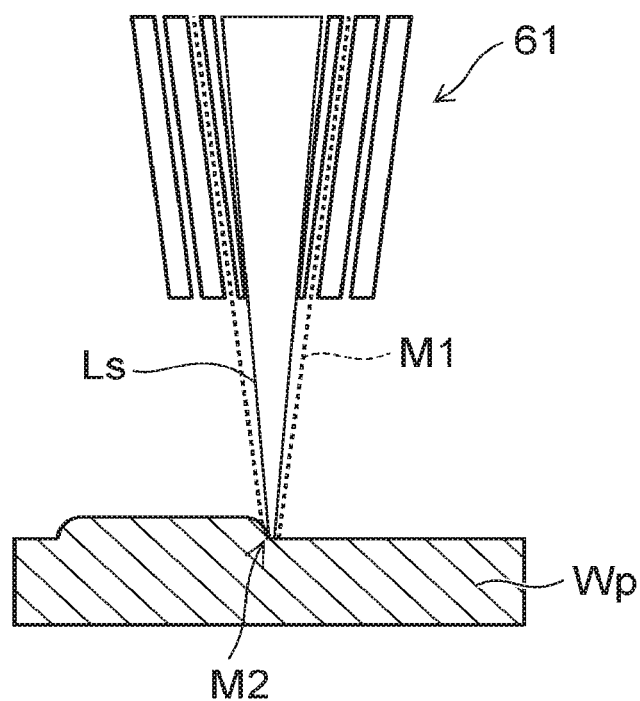
FIG. 14 is a schematic cross-sectional view illustrating a method for manufacturing the optical element according to the embodiment.

FIG. 14 is a schematic cross-sectional view illustrating a method for manufacturing the optical element according to the embodiment.

As shown in FIG. 14, a manufacturing apparatus 310 includes a head 61 emitting a light Ls and a raw material M1. While supplying the raw material M1 on a processed body Wp, the light Ls is applied. The light Ls is, for example, a laser light. The light Ls is concentrated in the vicinity of the surface of the processed object Wp. For example, the raw material M1 is melted by thermal energy due to the light Ls. A melt region M2 is formed. The melted raw material M1 is cooled to form a part of the optical element. While changing the relative position between the processed object Wp and the head 61, this operation is performed. Thereby, a desired shaped optical element is obtained. In this example, for example, the optical element is formed by a directional energy deposition method.

At this time, the above operation is performed by using multiple raw materials with mutually different refractive indexes as the raw material M1. A desired refractive index distribution can be formed in the desired region (first region 11) in the optical element by changing a ratio of the multiple raw materials.

FIG. 15A and FIG. 15B are schematic views illustrating another method for manufacturing the optical element according to the embodiment.

As shown in FIG. 15A, a manufacturing apparatus 311 includes a head 62 emitting the raw material M1. The head 62 moves relatively to the processed object Wp. In this example, the relative position of the head 62 and the processed object Wp is changed in the X-direction, the Y-direction and the Z-direction.

As shown in FIG. 15B, a liquid including the raw material M1 is emitted from the head 62. The liquid adheres to the processed object Wp. In this example, the head 62 is provided with a light irradiation unit 62a. A light (for example, ultraviolet light) is emitted from the light irradiation unit 62a. Thereby, for example, the raw material M1 included in the liquid is left on the processed object Wp to form a portion serving as a part of the optical element. For example, the head 62 may be provided with a flattening unit 62b (for example, roller). The above portion formed from the raw material M1 is flattened. This operation is repeated while changing the relative position of the head 62 and the processed object Wp. Thereby, the desired shaped optical element is obtained.

Also at this time, the above operation is performed by using multiple raw materials with mutually different refractive indexes. A desired refractive index distribution can be formed in the desired region (first region 11) in the optical element by changing a ratio of the multiple raw materials.

FIG. 16A and FIG. 16B are schematic views illustrating another method for manufacturing the optical element according to the embodiment.

As shown in FIG. 16A, in a manufacturing apparatus 312, a stage ST is provided. A layer including the raw material M1 is formed on the stage ST. For example, the raw material M1 is stored in a storage unit 63. A desired thickness layer (a layer including the raw material M1) is formed on the stage ST by controlling a height of the stage ST.

As shown in FIG. 15B, the layer is irradiated with the light Ls having the desired shape. A portion serving as a part of the optical element can be formed at the desired position by changing the relative position of the light Ls and the stage ST.

Also at this time, the above operation is performed by using multiple raw materials with mutually different refractive indexes. A desired refractive index distribution can be formed in the desired region (first region 11) in the optical element by changing a ratio of the multiple raw materials.

According to the embodiments, an optical element providing desired optical characteristics with high controllability and a photo detection device can be provided.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in optical elements and photo detection devices such as regions, photo detection units, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all optical elements and photo detection devices practicable by an appropriate design modification by one skilled in the art based on the optical elements and the photo detection devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

The invention claimed is:

1. An optical element having a first surface and a second surface opposite to the first surface, the optical element comprising:
   a first region; and
   a third region, a first refractive index of the first region being asymmetric with respect to a first axis, the first axis passing through a first position and being parallel to a first thickness direction, the first refractive index being highest or lowest at the first position in the first region, the first thickness direction being from the first surface toward the second surface in the first region, a position of the third region along the first thickness direction being different from a position of the first region along the first thickness direction, the third region having a third refractive index, the third refractive index changing along a third direction perpendicular to the first thickness direction, the third refractive index having at least one of a rate of change in the third direction different from a rate of change in the first thickness direction, or a rate of change in the third direction being asymmetric with respect to a third axis, the third axis passing through a third position and being parallel to the first thickness direction, the third refractive index being highest or lowest at the third position in the third region.

2. The optical element according to claim 1, wherein the first refractive index is asymmetric with respect to a first plane parallel to the first axis.

3. The optical element according to claim 2, wherein the first refractive index is asymmetric with respect to a second plane parallel to the first axis and crossing the first plane.

4. The optical element according to claim 1, wherein at least one of the first surface or the second surface is a curved surface.

5. The optical element according to claim 1, further comprising: a second region, the second region being arranged with the first region in a direction crossing the first thickness direction, the second region having a second refractive index, the second refractive index changing along a second direction, the second direction being perpendicular to a second thickness direction from the first surface toward the second surface of a position of the second region, and the second refractive index having at least one of a rate of change in the second direction different from a rate of change in the second thickness direction, or a rate of change in the second direction being asymmetric with respect to a second axis, the second axis passing through a second position and being parallel to the second thickness direction, the second refractive index being highest or lowest at the second position in the second region.

6. The optical element according to claim 5, wherein
a rate of change of the first refractive index in the first direction is asymmetric with respect to the first axis,
the first region includes a first end and a second end arranged in a first direction, and
a distance between the first end and the first position is shorter than a distance between the second end and the first position.

7. The optical element according to claim 5, wherein the first axis is non-parallel to the second axis.

8. The optical element according to claim 5, wherein
the first region has a first focal distance, and
the second region has a second focal distance different from the first focal distance.

9. A photo detection device comprising:
the optical element according to claim 5;
a first detection unit, a light passing through the first region being incident to the first detection unit; and
a second detection unit, a light passing through the second region being incident to the second detection unit.

10. A photo detection device comprising:
the optical element according to claim 5; and
a detection unit, a light passing through the first region and the second region being incident to the detection unit.

11. The optical element according to claim 1, wherein
the first refractive index changes along a first direction perpendicular to the first thickness direction, and
the third direction crosses the first direction.

12. A photo detection device comprising:
an optical element; and
a detection unit, a light passing through a first region and a second region being incident to the detection unit,
the optical element having a first surface and a second surface opposite to the first surface, the optical element comprising:
the first region; and
the second region,
a first refractive index of the first region being asymmetric with respect to a first axis, the first axis passing through a first position and being parallel to a first thickness direction, the first refractive index being highest or lowest at the first position in the first region, the first thickness direction being from the first surface toward the second surface in the first region,
the second region being arranged with the first region in a direction crossing the first thickness direction,
the second region having a second refractive index,
the second refractive index changing along a second direction, the second direction being perpendicular to a second thickness direction from the first surface toward the second surface of a position of the second region, and
the second refractive index having at least one of
a rate of change in the second direction different from a rate of change in the second thickness direction, or
a rate of change in the second direction being asymmetric with respect to a second axis, the second axis passing through a second position and being parallel to the second thickness direction, the second refractive index being highest or lowest at the second position in the second region.

* * * * *